(12) United States Patent
Rhew et al.

(10) Patent No.: US 10,277,210 B1
(45) Date of Patent: Apr. 30, 2019

(54) CLOCK SKEW SUPPRESSION FOR TIME-INTERLEAVED CLOCKS

(71) Applicant: AVAGO TECHNOLOGIES INTERNATIONAL SALES PTE. LIMITED

(72) Inventors: Hyo Gyuem Rhew, Irvine, CA (US); Adesh Garg, Aliso Viejo, CA (US); Meisam Honarvar Nazari, Irvine, CA (US); Jiawen Zhang, Irvine, CA (US); Ali Nazemi, Aliso Viejo, CA (US); Jun Cao, Ivine, CA (US)

(73) Assignee: AVAGO TECHNOLOGIES GENERAL IP (SINGAPORE) PTE. LTD., Singapore (SG)

( * ) Notice: Subject to any disclaimer, the term of this patent is extended or adjusted under 35 U.S.C. 154(b) by 0 days.

(21) Appl. No.: 15/794,667

(22) Filed: Oct. 26, 2017

(51) Int. Cl.
| | |
|---|---|
| *H03M 1/66* | (2006.01) |
| *H03K 5/08* | (2006.01) |
| *H03M 1/12* | (2006.01) |
| *H04B 1/04* | (2006.01) |
| *H04B 1/16* | (2006.01) |

(52) U.S. Cl.
CPC ............. *H03K 5/08* (2013.01); *H03M 1/121* (2013.01); *H03M 1/124* (2013.01); *H03M 1/662* (2013.01); *H04B 1/04* (2013.01); *H04B 1/16* (2013.01)

(58) Field of Classification Search
CPC ........ H03K 5/08; H03M 1/121; H03M 1/124; H04B 1/16
USPC .................. 341/144, 155, 122, 159, 141
See application file for complete search history.

(56) References Cited

U.S. PATENT DOCUMENTS

| | | | |
|---|---|---|---|
| 7,961,123 B2 * | 6/2011 | Nagarajan ........... | H03M 1/1057 341/118 |
| 9,553,600 B1 * | 1/2017 | Lacroix ............... | H03M 1/0624 |
| 2001/0035994 A1 * | 11/2001 | Agazzi ................ | H03M 1/0604 398/135 |
| 2014/0253195 A1 * | 9/2014 | Chandrasekaran .. | H03K 5/1565 327/175 |

* cited by examiner

*Primary Examiner* — Peguy Jean Pierre
(74) *Attorney, Agent, or Firm* — Xsensus/Broadcom (57) ABSTRACT

A time-interleaved clock circuit, including circuitry to provide multiple clock components of a sampling clock. The clock components are corrected by averaging pairs of the multiple clock components in order to output averaged signals. The time-interleaved clock is applied to data conversion in which input signals of the analog signal domain or of the digital signal domain are sampled based on the corrected clock components and converted to the digital signal domain or the analog signal domain, respectively.

20 Claims, 10 Drawing Sheets

CLOCK SKEW SUPPRESSION FOR TIME-INTERLEAVED CLOCKS

FIELD OF DISCLOSURE

This disclosure generally relates to time-interleaved clocks that suppress clock phase mismatch, and particularly clocks for use in a data converter for high-speed data transmission.

BACKGROUND

Interleaved clocks may suffer from clock phase mismatch, especially as the output frequency increases towards the Nyquist frequency. Thus, there is a need to address this clock phase mismatch in order to insure performance at high frequency.

Possible approaches to solving this clock phase mismatch include using a dedicated circuit block such as a high-speed phase detector or using an injection locking oscillator. However, the inclusion of a high-speed phase detector as a dedicated circuit block adds extra loading on the highest speed clock path for phase correction. In particular, loading can become very high if wide skew correction range is necessary. Such high loading can lead to degradation of clock quality. Also, clock skew correction interrupts the synchronization loop and makes the calibration process complicated if a phase-interpolator is used for the correction block. In addition, the inclusion of a high-speed phase detector adds extra loading on the highest speed clock path for phase detection.

Still further, a high-speed phase detector may have limited performance due to limited bandwidth or offset. Typically, increasing device size in order to reduce offset inflates loading. A conventional current phase detection circuit's sensitivity is limited. Also, the conventional detection circuit typically requires an inductor which consumes a large area.

The alternative solution of using an injection locking oscillator also has several disadvantages. Using an injection locking oscillator may only work for a very narrow frequency range. The rise-time/fall-time of the injection locking oscillator may have large variations over different frequencies. The injection locking oscillator also requires many stages to effectively cancel input clock mismatch. The duty cycle error of a clock may not be corrected and may sometimes increase. Further, the injection locking oscillator involves a difficult circuit layout that easily creates high systematic phase offset.

Furthermore, clock phase itself is difficult to control, and may involve adding a dedicated circuit.

The present disclosure provides solutions to one or more of the above-noted problems in conventional interleaved data converters.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION

Communications devices may process signals digitally for simplification in processing and reduction in power. Receivers in such communications devices may include an analog-to-digital converter (ADC) to convert the received analog signal to a digital signal for internal processing. Transmitters in such communications devices may include a digital-to-analog converter (DAC) to convert a digital signal to an analog signal for transmission. Such communications devices may include wireline or wireless communications devices as one of ordinary skill would recognize. Devices such as ADC and DAC may be operated by way of interleaved clocks. A clock phase mismatch can arise between a set of interleaved clocks, especially as the output frequency increases towards the Nyquist frequency.

An arrangement according to exemplary aspects, averages pairs of clocks to eliminate mismatch between interleaved clock signals An arrangement may be used to eliminate mismatch where the initial signal has amplitude mismatch, and an arrangement may be used to eliminate mismatch where the initial signal has phase mismatch.

Figure 1:
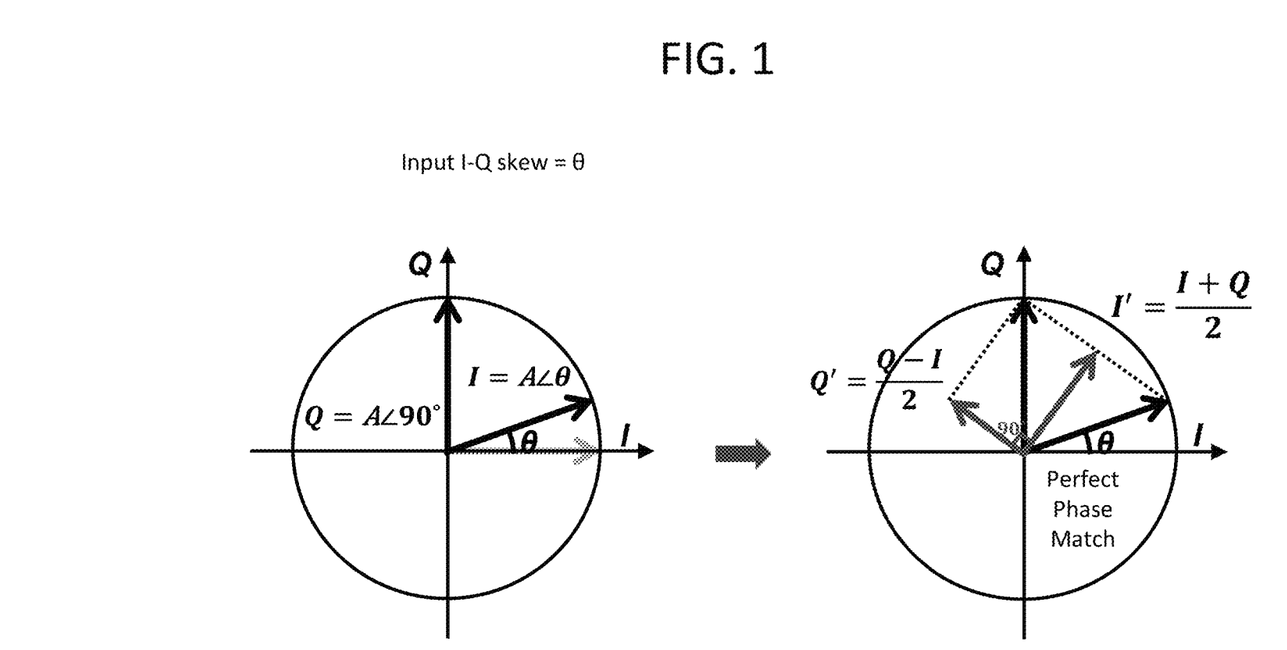
FIG. 1 is a graph illustrating conversion of phase mismatch to amplitude mismatch according to exemplary aspects of the present disclosure.

FIG. 1 is a graph that illustrates the effect of converting from phase to amplitude according to an exemplary embodiment of the present disclosure. Provided an input of I and Q channels, having a skew of θ, the average of I and Q converts phase mismatch to amplitude mismatch.

Figure 2:
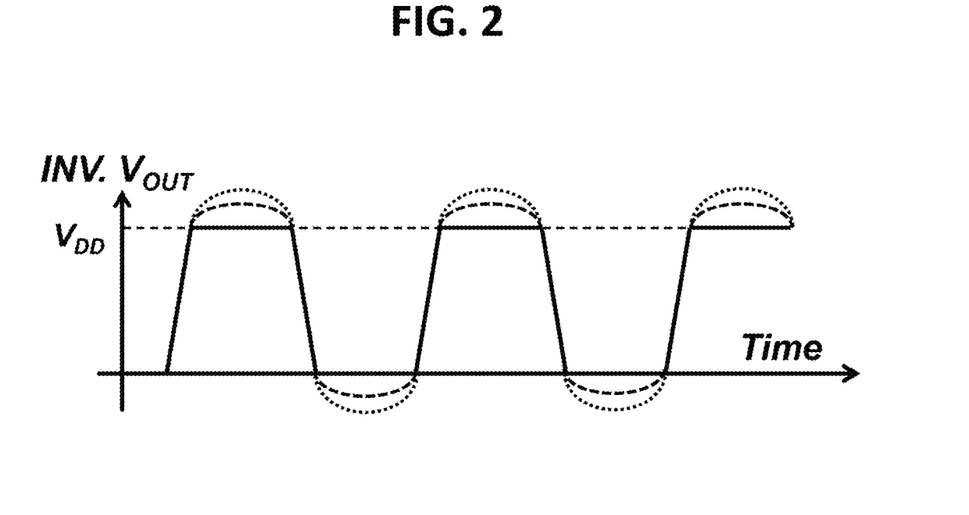
FIG. 2 is a diagram of amplitude mismatch elimination according to exemplary aspects of the present disclosure.

Phase itself is difficult to control and may require a dedicated circuit such as a phase interpolator. However, an amplitude regulator circuit, such as a CMOS inverter, CML inverter, buffer, operational amplifier, can perform amplitude regulation. For example, as illustrated in FIG. 2, the amplitude mismatch of the voltage Vout may be eliminated by an amplitude regulator that clips the amplitude.

Figure 3:
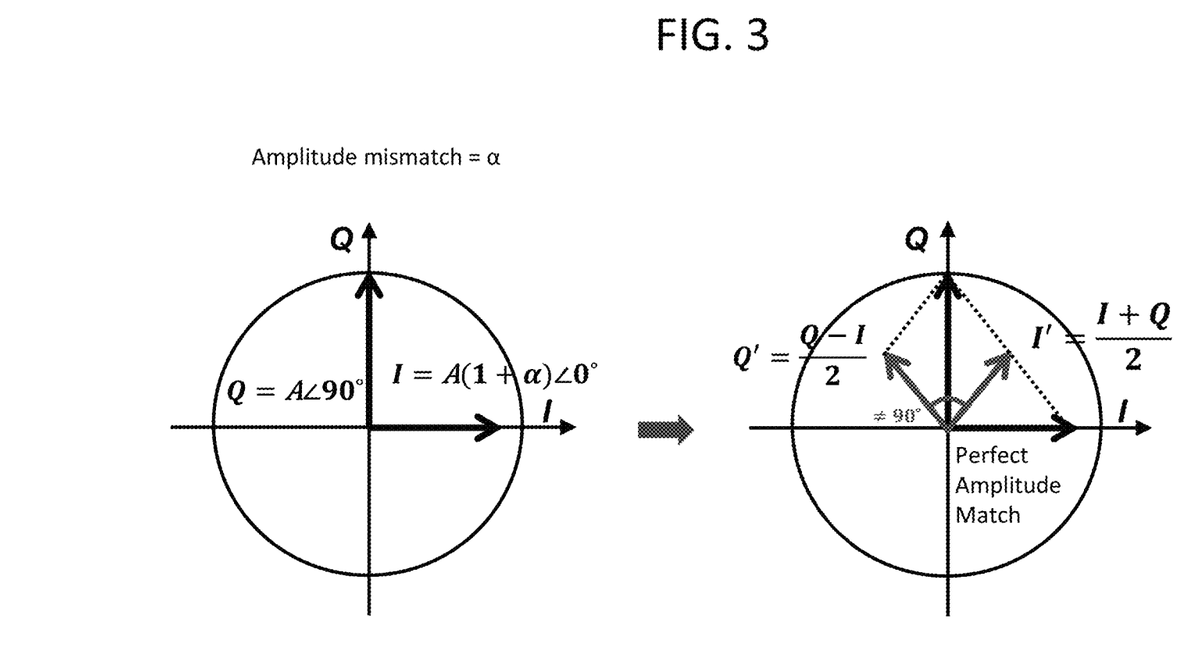
FIG. 3 is a graph illustrating conversion of amplitude mismatch to phase mismatch according to exemplary aspects of the present disclosure.

FIG. 3 is a graph that illustrates the effect of converting from amplitude to phase according to exemplary aspects of the disclosure. Provided an input of I and Q channels, having an amplitude mismatch of a, the average of I and Q converts the amplitude mismatch to phase mismatch.

An aspect is one or more averaging stages, where each averaging stage converts the type of mismatch. For example, the averaging stages may convert from a phase mismatch to an amplitude mismatch, or convert from an amplitude mismatch to a phase mismatch. A final stage may be an averaging stage that converts to the amplitude mismatch. Any of the averaging stages may include amplitude regulators that reduce or eliminate amplitude mismatch.

Figure 4:
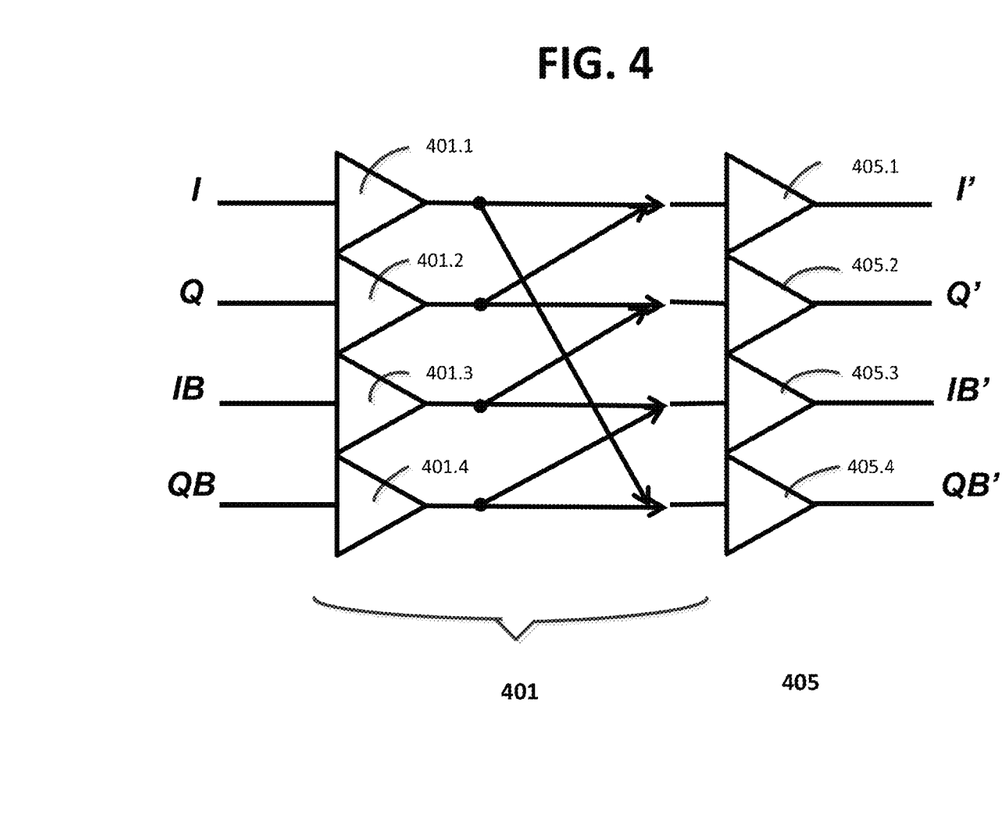
FIG. 4 is a schematic illustrating an example of a single stage averaging architecture according to an exemplary aspect of the present disclosure.

FIG. 4 illustrates a single stage averaging architecture to eliminate skew between phase clocks according to an exemplary aspect of the disclosure. Herein the skew between phase clocks of I and Q channels is referred to as IQ skew. Although the architecture shown in FIG. 4 includes four interleaved channels, arrangements may include a larger number of interleaved channels. The architecture shown in FIG. 4 removes phase mismatches in quadrature clock phases including clocks for an I channel, a Q channel, an Ib channel, and a Qb channel. In the case of IQ phase skew, a clock phase is converted to amplitude by an averaging stage 401 that averages each pair of clock signals for input channels, for example, averaging clock signals for channels I and Q. An aspect is amplitude mismatch may be eliminated by stage 405 that clips amplitude of voltage received from the averaging stage 401.

In the exemplary aspect, the clock signals for the I channel signal and the Q channel are first passed through respective amplitude regulators 401.1 and 401.2 and combined to obtain an average clock signal of the I channel and the Q channel. Although 401.1, 401.2, 401.3, 401.4 are shown as buffers, any amplitude regulation circuits, such as CMOS inverters, CML inverters, operational amplifiers, may be incorporated as one of ordinary skill would recognize. The averaging of clock signals for I channel and Q channel converts a phase mismatch to an amplitude mismatch. The averaged signal may be passed to amplitude regulator 405.1 which clips the voltage at a threshold amplitude to obtain a clipped voltage signal I'. Also, the clock signals for the Q channel signal and the IB channel signal are first passed through respective amplitude regulators 401.2 and 401.3 and combined to obtain an average clock signal of the Q channel and the IB channel. The averaging of clock signals for Q channel and IB channel converts a phase mismatch to an amplitude mismatch. The averaged signal may be passed to amplitude regulator 405.2 which clips the voltage at a threshold amplitude to obtain a clipped voltage signal Q'. Also, the IB channel signal and the QB channel signal are first passed through respective amplitude regulators 401.3 and 401.4 and combined to obtain an average clock signal of the IB channel and the QB channel. The averaging of clock signals of IB channel and QB channel converts a phase mismatch to an amplitude mismatch. The averaged signal may be passed to amplitude regulator 405.3 which clips the voltage at a threshold amplitude to obtain a clipped voltage signal IB'. Also, the clock signals for I channel and the QB channel are first passed through respective amplitude regulators 401.1 and 401.4 and combined to obtain an average clock signal of the I channel and the QB channel. The averaging of clock signals of I channel and QB channel converts a phase mismatch to an amplitude mismatch. The averaged signal may be passed to amplitude regulator 405.4 which naturally clips the voltage at a threshold amplitude to obtain a clipped voltage signal QB'.

Figure 5:
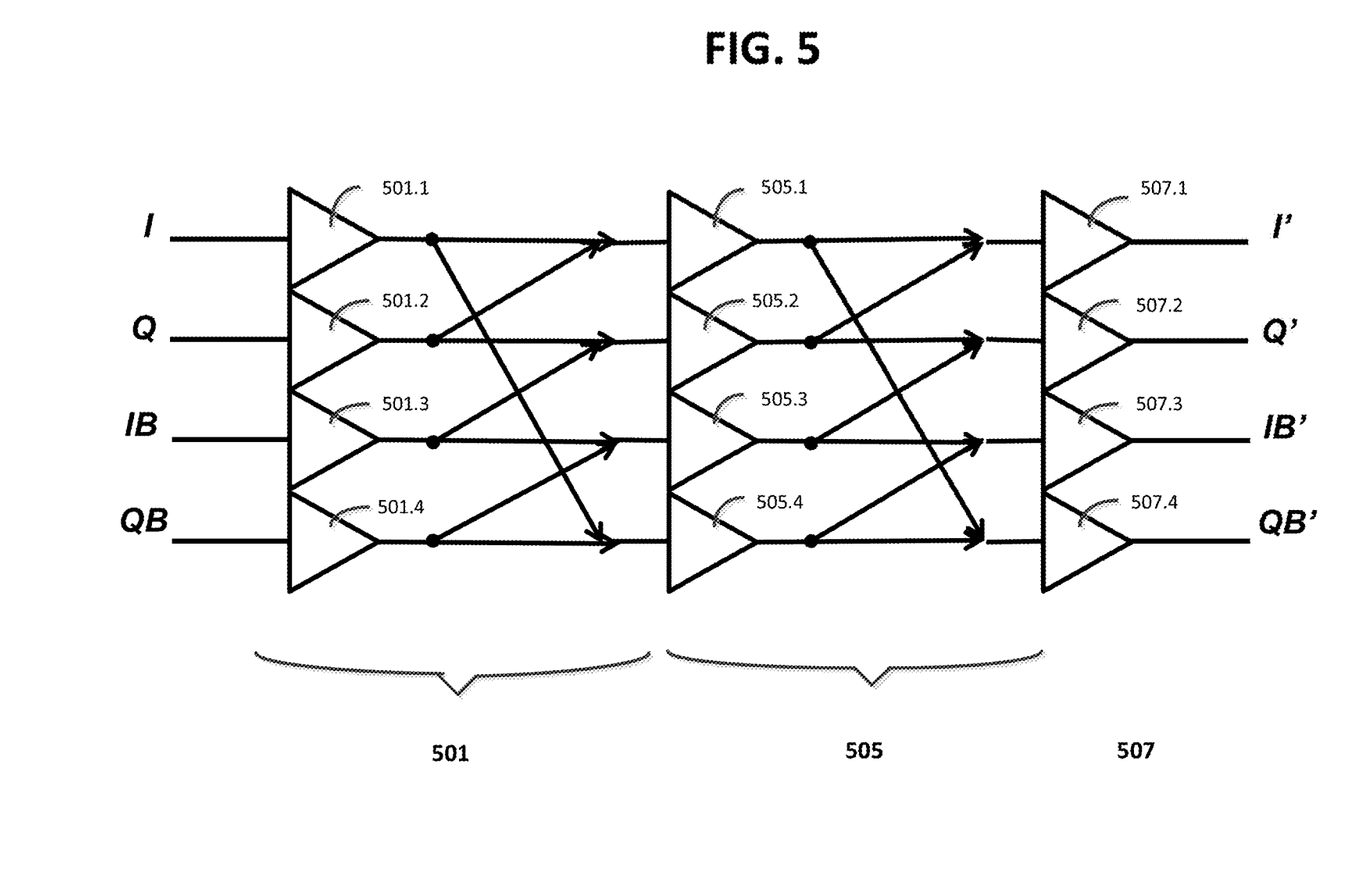
FIG. 5 is a schematic illustrating an example of a two stage averaging architecture according to an exemplary aspect of the present disclosure.

FIG. 5 illustrates the case of amplitude mismatch between clock signals, the amplitude mismatch may be convened to phase mismatch by a first averaging stage 501 that averages each pair of clock signals for input channels. The phase mismatch is then convened to amplitude mismatch in a second averaging stage 505. The resulting amplitude mismatch is eliminated by amplitude regulators 507 to obtain the signals having matching phases, I', Q', Ib', and Qb'.

In the exemplary aspect, the clock signals for I channel and the Q channel are first passed through respective amplitude regulators 501.1 and 501.2 and combined to obtain an average of the clock signals of the I channel and the Q channel. The averaging of clock signals of I channel and Q channel converts an amplitude mismatch to a phase mismatch. The averaged signal may be passed to amplitude regulator 505.1. Also, the clock signals of the Q channel and the IB channel are first passed through respective amplitude regulators 501.2 and 501.3 and combined to obtain an average of the clock signals of the Q channel and the IB channel. The averaging of clock signals for Q channel and IB channel converts an amplitude mismatch to a phase mismatch. The averaged signal may be passed to amplitude regulator 505.2. Also, the clock signals of the IB channel and the QB channel are first passed through respective amplitude regulators 501.3 and 501.4 and combined to obtain an average of the clock signals of the IB channel and the QB channel. The averaging of clock signals of IB channel and QB channel converts an amplitude mismatch to a phase mismatch. The averaged signal may be passed to amplitude regulator 505.3. Also, the clock signals of the I channel and the QB channel are first passed through respective amplitude regulators 501.1 and 501.4 and combined to obtain an average of the clock signals of the I channel and the QB channel. The averaging of clock signals of the I channel and the QB channel converts an amplitude mismatch to a phase mismatch. The averaged signal may be passed to amplitude regulator 505.4.

The signals passed through amplitude regulators 505.1 and 505.2 are combined to obtain an average of the two signals. The averaging of the two signals converts a phase mismatch to an amplitude mismatch. The averaged signal may be passed to amplitude regulator 507.1 which naturally clips the voltage at a threshold amplitude to obtain a clipped voltage signal I'. The signals passed through amplitude regulators 505.2 and 505.3 are combined to obtain an average of the two signals. The averaging of the two signals converts a phase mismatch to an amplitude mismatch. The averaged signal may be passed to amplitude regulator 507.2 which naturally clips the voltage at a threshold amplitude to obtain a clipped voltage signal Q'. The signals passed through amplitude regulators 505.3 and 505.4 are combined to obtain an average of the two signals. The averaging of the two signals converts a phase mismatch to an amplitude mismatch. The averaged signal may be passed to amplitude regulator 507.3 which naturally clips the voltage at a threshold amplitude to obtain a clipped voltage signal IB'. The signals passed through amplitude regulators 505.1 and 505.4 are combined to obtain an average of the two signals. The averaging of the two signals converts a phase mismatch to an amplitude mismatch. The averaged signal may be passed to amplitude regulator 507.4 which naturally clips the voltage at a threshold amplitude to obtain a clipped voltage signal QB'.

Figure 6:
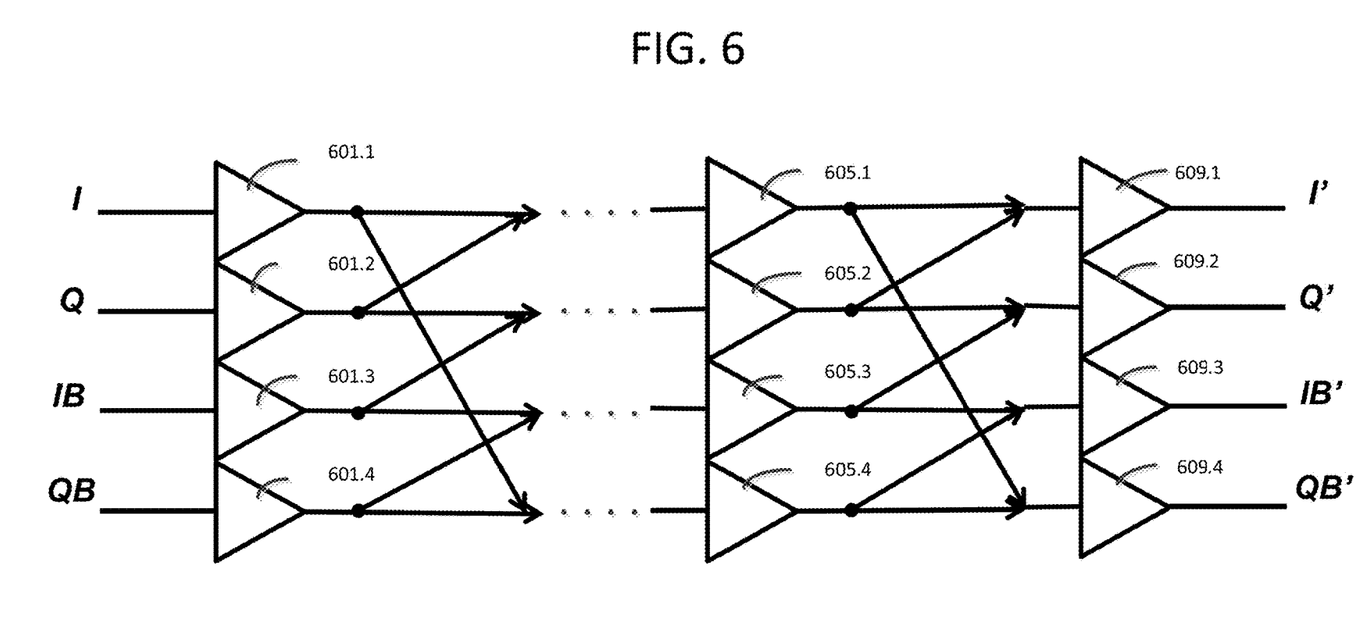
FIG. 6 is a schematic illustrating another example of an averaging architecture according to exemplary aspects of the present disclosure.

FIG. 6 illustrates another multi-stage averaging architecture to eliminate skew between phase clocks according to exemplary aspects of the disclosure. Amplitude regulation may be accomplished by chaining averaging stages that suppress the amplitude mismatch. In other words, provided a chained series of averaging stages, the output signals of a final averaging stage will be amplitude regulated signals without mismatch.

Regarding FIG. 6, in the exemplary aspect, the clock signals for I channel and the Q channel are first passed through respective amplitude regulators 601.1 and 601.2 and combined to obtain an average of the clock signals of the I channel and the Q channel. The averaging of clock signals of I channel and Q channel reduces mismatch between the signals. Also, the clock signals of the Q channel and the IB channel are first passed through respective amplitude regulators 601.2 and 601.3 and combined to obtain an average of the clock signals of the Q channel and the IB channel. The averaging of clock signals for Q channel and IB channel reduces mismatch between the signals. Also, the clock signals of the IB channel and the QB channel are first passed through respective amplitude regulators 601.3 and 601.4 and combined to obtain an average of the clock signals of the IB channel and the QB channel. The averaging of clock signals of IB channel and QB channel reduces mismatch between the signals. Also, the clock signals of the I channel and the QB channel are first passed through respective amplitude regulators 601.1 and 601.4 and combined to obtain an average of the clock signals of the I channel and the QB channel. The averaging of clock signals of the I channel and the QB channel reduces mismatch between the signals. After passing through several states, the signals passed through amplitude regulators 605.1 and 605.2 are combined to obtain an average of the two signals. The averaging of the two signals converts a mismatched signal to a regulated amplitude signal. Also, the signals passed through amplitude regulators 605.2 and 605.3 are combined to obtain an average of the two signals. The averaging of the two signals converts a mismatched signal to a regulated amplitude signal. Also, the signals passed through amplitude regulators 605.3 and 605.4 are combined to obtain an average of the two signals. The averaging of the two signals converts a mismatched signal to a regulated amplitude signal. The signals passed through amplitude regulators 605.1 and 605.4 are combined to obtain an average of the two signals. The averaging of the two signals converts a mismatched signal to a regulated amplitude signal. The regulated amplitude signals may be handled by drivers 609.1, 609.2, 609.3, 609.4, respectively.

Data converters may be used to sample a variety of analog waveforms in the form of radio-frequency wave, sound waves, or voltage signals. An interleaved data converter is a core block that enables high-speed reception or transmission of the variety of waveforms. An interleaved data converter achieves high-speed reception or transmission by parallel data converters clocked by interleaved clocks.

Tones created from interleaved clock mismatch degrade the data converter's performance. For example, performance of a quarter-rate digital-to-analog converter (DAC) is degraded by a $(F_{out}-F_s/2)$ tone when quadrature CK skew is present. Effective number of bits (ENOB) performance of a half-rate DAC with quadrature CK skew is degraded.

Communications devices may process signals digitally for simplification in processing and reduction in power. Receivers in such communications devices may include an analog-to-digital converter (ADC) to convert the received analog signal to a digital signal for internal processing. Transmitters in such communications devices may include a digital-to-analog converter (DAC) to convert a digital signal to an analog signal for transmission. Such communications devices may include wireline or wireless communications devices as one of ordinary skill would recognize.

A time-interleaved data converter is a type of core block that may be used as the ADC and DAC of a communications device that requires high-speed data transmission. A time-interleaved data converter is an effective way to implement a high sampling rate with a set of slow converters arranged in parallel. The set of converters operate at interleaved sampling times as if they were a single converter operating at a higher sampling rate. However, a clock phase mismatch can arise between the set of converters, especially as the output frequency increases towards the Nyquist frequency. In particular, tones created from interleaved clock mismatch degrade the data converter's performance.

Figure 7:
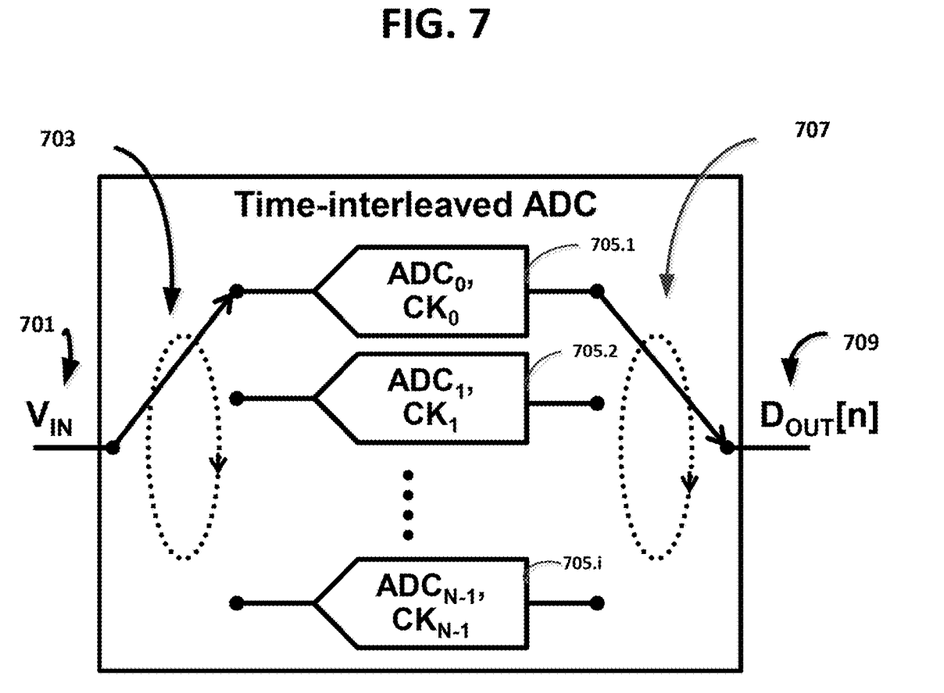
FIG. 7 is a schematic of a time-interleaved ADC system according to exemplary aspects of the present disclosure.

FIG. 7 illustrates a block diagram of a time interleaved ADC system according to an exemplary embodiment of the present disclosure. The time interleaved ADC system converts an analog input 701 from an analog signal domain to a digital signal domain to provide digital output samples 709. The multi-lane ADC samples the analog input according to multiple phases of a sampling clock. Ideally, the multiple phases of the sampling clock are non-overlapping. However, some overlap between the multiple phases of the sampling clock may exist while having the digital output samples still accurately represent the analog input.

The time interleaved ADC system may include an interleaving structure 703, sub-ADCs 705.1 through 705.i, and a switching module 607. The interleaving structure 703 samples the analog input 701 in accordance with multiple phases 0 to N−1 of a sampling clock to separate the analog input 701 into selected analog inputs. Each sub-ADC 705.1 to 705.i operates with one of the phase clocks (CK) 0 to N−1. The digital output samples are output as a single combined signal 709 which acts as though the sub-ADCs are a single ADC converter. A mismatch between clock phases, or phase skew, degrades the time interleaved ADC's performance.

Figure 8:
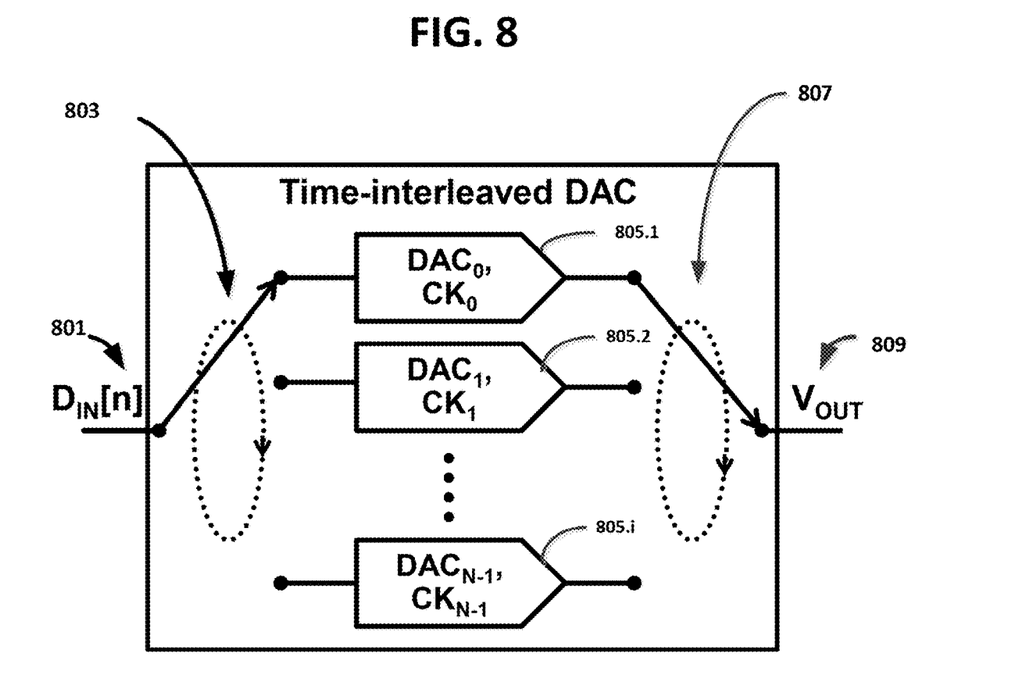
FIG. 8 is a schematic of a time-interleaved DAC system according to exemplary aspects of the present disclosure.

FIG. 8 illustrates a block diagram of a time interleaved DAC system according to an exemplary embodiment of the present disclosure. The time interleaved DAC system converts a digital input 801 of n-bits of a digital signal domain to an analog signal domain to provide analog output samples 809. The time interleaved DAC system may include an interleaving structure 803, sub-DACs 805.1 through 805.i and a switching module 807. The interleaving structure 803 samples the digital input 801 in accordance with multiple phases 0 to N−1 of a sampling clock to separate the digital input 801 into selected digital inputs. Each sub-DAC 805.1 to 805.i operates with one of phase clocks (CK) 0 to N−1. A mismatch between clock phases, or phase skew, degrades the time interleaved DAC's performance.

Figure 9:
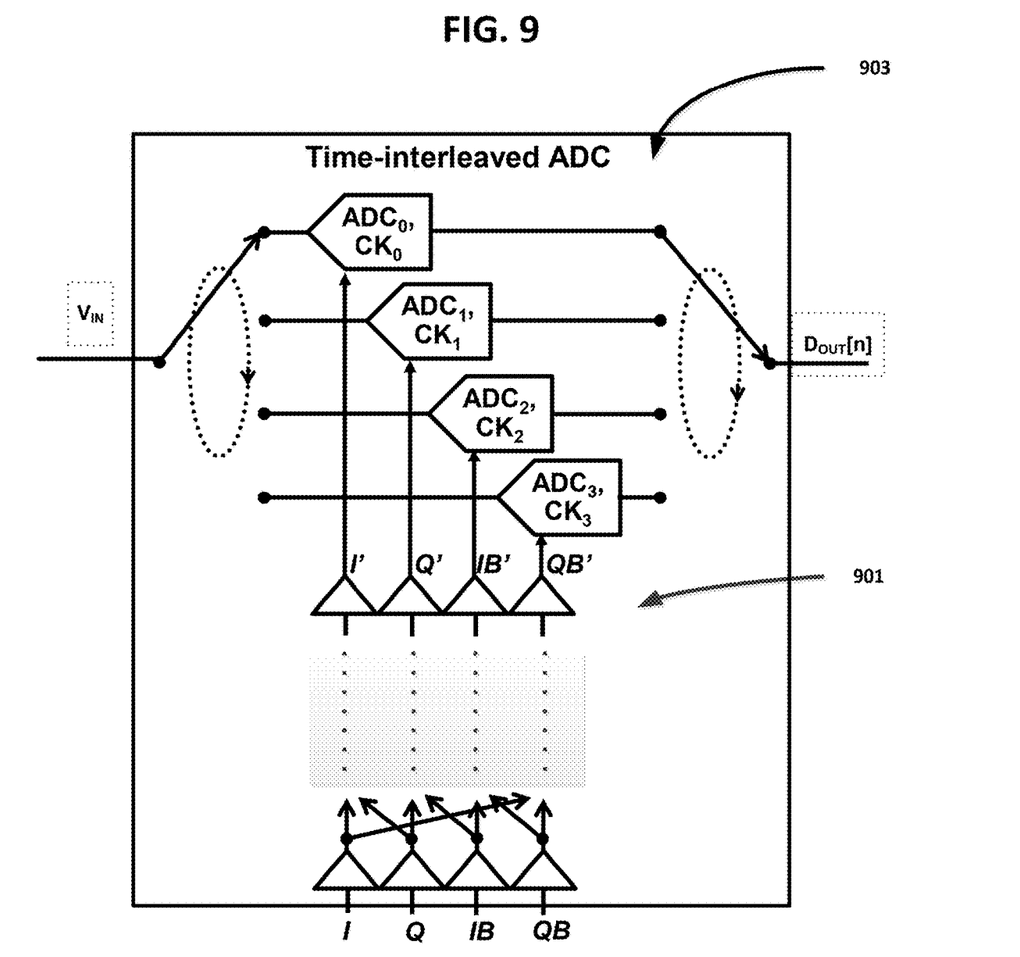
FIG. 9 is a schematic of a time-interleaved analog-to-digital converter with an averaging architecture according exemplary aspects of the present disclosure.

FIG. 9 illustrates a time-interleaved analog-to-digital converter 903 having time-interleaved clock circuits 901, such as that shown in FIG. 4, 5 or 6. The signals I, Q, Ib, Qb are components of the signal to be converted. Although four components are shown, the signal to be converted may be divided into any number of components. The clock circuits 901 provide interleaved clock signals without phase skew by averaging each pair of clock signals for respective channels. Subsequently, each sampling clock in the time-interleaved analog-to-digital converter has matched phases.

Figure 10:
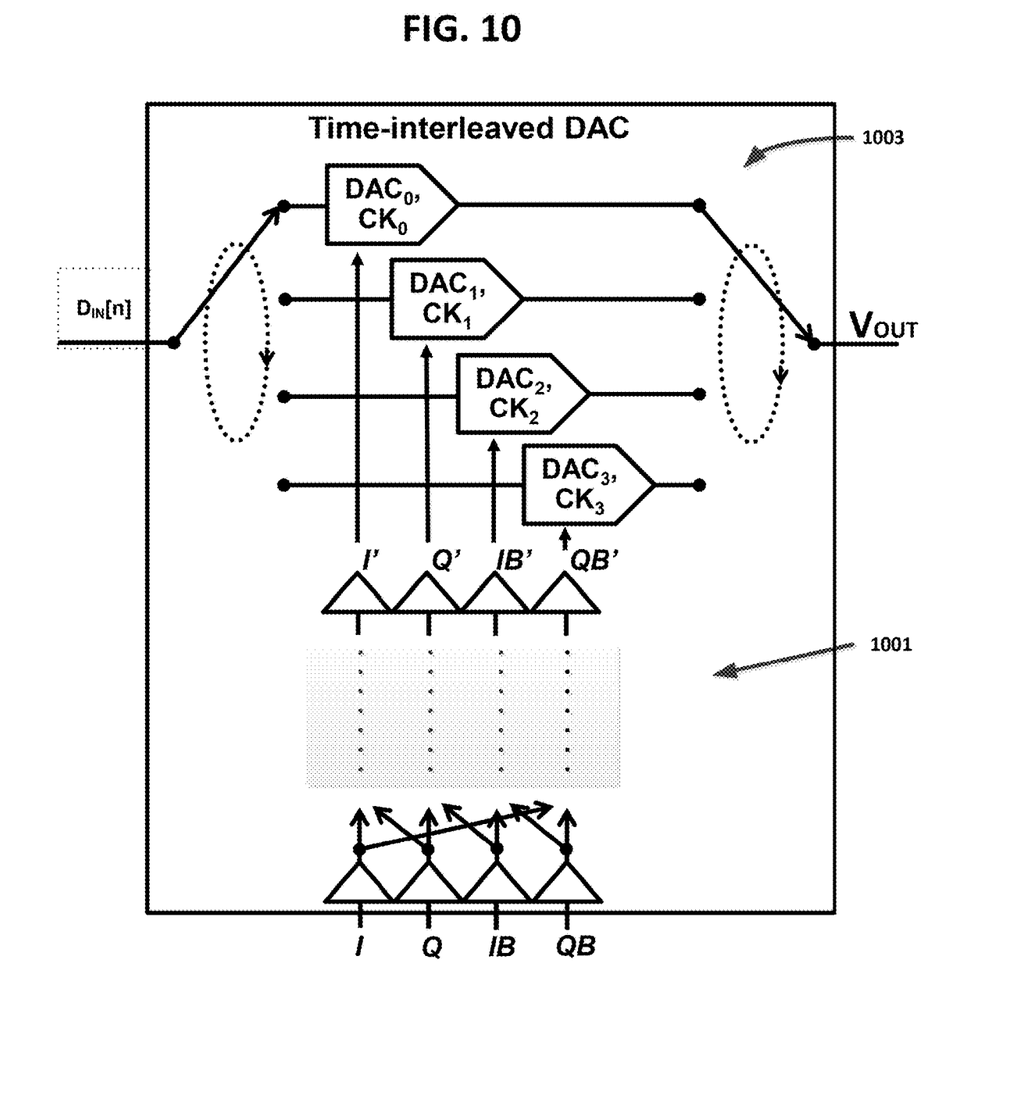
FIG. 10 is a schematic of a time-interleaved digital-to-analog converter with an averaging architecture according to exemplary aspects of the present disclosure.

FIG. 10 illustrates a time-interleaved digital-to-analog converter 1003 having time-interleaved clock circuits 1001, such as that shown in FIG. 4, 5 or 6. The signals I, Q, Ib, Qb are components of the signal to be converted. Although four components are shown, the signal to be converted may be divided into any number of components. The clock circuits 1001 provide interleaved clock signals without phase skew by averaging each pair of clock signals for respective channels. Subsequently, each sampling clock in the time-interleaved digital-to-analog converter has matched phases.

The averaging architecture of the present disclosure provides several advantages over other approaches to suppress phase mismatch. The averaging architecture reduces incoming phase skew. Only minimal startup calibration is required for interleaved clock adjustments to achieve ENOB performance.

Also, SFDR (Spurious-Free Dynamic Range) is improved. Because a skew correction circuit may not be necessary, area and power for the clock circuits of a converter is significantly reduced. Unlike the case of using a skew correction circuit, there is no loading overhead at the highest frequency clock path.

The averaging architecture is scalable and can accommodate a wide frequency range, on the order of 64 GHz to 108 GHz. The averaging architecture enables data converters with sampling rates of greater than 100 GS/s.

A system which includes the features in the foregoing description provides numerous advantages. In particular, the DAC based transmitter described herein can achieve high speed and high performance simultaneously.

Numerous modifications and variations are possible in light of the above teachings. It is therefore to be understood that within the scope of the appended claims, the invention may be practiced otherwise than as specifically described herein.

Thus, the foregoing discussion discloses and describes merely exemplary embodiments of the present invention. As will be understood by those skilled in the art, the present invention may be embodied in other specific forms without departing from the spirit or essential characteristics thereof. Accordingly, the disclosure of the present invention is intended to be illustrative, but not limiting of the scope of the invention, as well as other claims. The disclosure, including any readily discernible variants of the teachings herein, defines, in part, the scope of the foregoing claim terminology such that no inventive subject matter is dedicated to the public.

The invention claimed is:

1. An apparatus, comprising:
    circuitry configured to
        provide multiple clock components of a sampling clock;
        average a pair of the multiple clock components to generate a first averaged signal;
        generate a corrected clock component by clipping an amplitude of the first averaged signal; and
        interleave corrected clock components for the respective multiple clock components.

2. An apparatus comprising:
    circuitry configured to
        provide multiple clock components of a sampling clock;
        average pairs of the multiple clock components to generate first averaged signals;
        average pairs of the first averaged signals to generate second averaged signals;
        clip an amplitude of the second averaged signals to generate corrected clock components; and
        interleave corrected clock components for the respective multiple clock components.

3. The apparatus of claim 2, wherein
    the multiple clock components of the sampling clock have clock phase skew, and
    the circuitry is further configured to
        perform the averaging to generate the first averaged signals to convert amplitude mismatch to phase mismatch;
        perform the averaging to generate the second averaged signals to convert phase mismatch to amplitude mismatch; and
        clip the second averaged signal to eliminate the amplitude mismatch.

4. The apparatus of claim 1, wherein the clipping performed by the circuitry includes clipping a voltage signal by an amplitude regulator.

5. The apparatus of claim 4, wherein the amplitude regulator is a CMOS inverter.

6. The apparatus of claim 1, wherein the circuitry includes a plurality of analog-to-digital converters.

7. The apparatus of claim 6, wherein the circuitry is further configured to:
    sample an analog input for the corrected clock component to provide a sampled analog input;
    convert, in the plurality of analog-to-digital converters, sampled analog inputs from the analog signal domain to the digital signal domain in response to the sampling clock to provide digital output segments; and
    interleave the digital output segments to produce digital output samples.

8. The apparatus of claim 1, wherein the circuitry is included in a receiver.

9. The apparatus of claim 1, wherein the circuitry is included in a transmitter.

10. The apparatus of claim 1, wherein the circuitry includes a plurality of digital-to-analog converters.

11. The apparatus of claim 10, wherein the circuitry is further configured to:
    sample a digital input for a corresponding corrected clock component generated from the multiple clock components to provide a sampled digital input;
    convert, in parallel, the sampled digital inputs from the digital signal domain to the analog signal domain in response to the sampling clock to provide analog output segments; and
    interleave the analog output segments to produce digital output samples.

12. A method comprising:
    providing multiple clock components of a sampling clock;
    averaging a pair of the multiple clock components to generate a first averaged signal;
    generating a corrected clock component by clipping an amplitude of the first averaged signal; and
    interleave corrected clock components for the respective multiple clock components.

13. The method of claim 12, further comprising:
    converting an analog input to a digital signal.

14. The method of claim 13, further comprising:
    sampling the analog input for a corresponding corrected clock component generated from the multiple clock components to provide a sampled analog input;
    converting, in parallel, the sampled analog inputs from the analog signal domain to the digital signal domain in response to the sampling clock to provide digital output segments; and
    interleaving the digital output segments to produce digital output samples as the digital signal.

15. The method of claim 12, further comprising:
    converting a digital input to an analog signal.

16. The method of claim 15, further comprising:
    sampling the digital input for a corresponding corrected clock component generated from the multiple clock components to provide a sampled digital input;
    converting, in parallel, the sampled digital inputs from the digital signal domain to the analog signal domain in response to the sampling clock to provide analog output segments; and
    interleaving the analog output segments to produce analog output samples as the analog signal.

17. The method of claim 12, further comprising:
driving an interleaved digital-to-analog converter by the interleaved corrected clock components.

18. The method of claim 17, further comprising clipping a voltage signal by an amplitude regulator.

19. The method of claim 12, further including averaging pairs of the first averaged signals in order to output a second averaged signal, clipping an amplitude of the second averaged signal, and outputting the clipped second averaged signal as the corrected clock component.

20. The method of claim 19, wherein the multiple clock components of the sampling clock have clock phase skew, the first averaging converts amplitude mismatch to phase mismatch, and the second averaging converts phase mismatch to amplitude mismatch, and the second averaged signal is clipped to eliminate the amplitude mismatch.

\* \* \* \* \*